United States Patent [19]

Joseph et al.

[11] 4,360,707

[45] Nov. 23, 1982

[54] DIGITALLY DRIVEN COMBINATION COILS FOR ELECTRODYNAMIC ACOUSTIC TRANSDUCERS

[75] Inventors: Joel R. Joseph, Libertyville, Ill.; William F. Bleeke, Vandalia, Mich.

[73] Assignee: CTS Corporation, Elkhart, Ind.

[21] Appl. No.: 209,948

[22] Filed: Nov. 24, 1980

[51] Int. Cl.³ .............................................. H04R 3/00
[52] U.S. Cl. .......................... 179/1 A; 179/115.5 DV; 330/10
[58] Field of Search ............. 179/115.5 DV; 330/118, 330/10

[56] References Cited

U.S. PATENT DOCUMENTS

| | | | |
|---|---|---|---|
| 1,992,300 | 2/1935 | Fanger | 179/116 |
| 2,762,870 | 9/1956 | Sziklai et al. | 179/1 A |
| 2,926,221 | 2/1960 | Kagdis | 179/115.5 R |
| 2,959,640 | 11/1960 | Schultz | 179/1 A |
| 3,055,991 | 9/1962 | Guss | 179/115.5 VC |
| 3,196,211 | 7/1965 | Kessenich | 179/1 A |
| 3,619,673 | 11/1971 | Helms | 310/13 |
| 3,686,446 | 8/1972 | Manger | 179/115.5 R |
| 3,935,399 | 1/1976 | Lian | 179/115.5 VC |
| 3,937,905 | 2/1976 | Manger | 179/115.5 R |
| 3,983,337 | 9/1976 | Babb | 179/115.5 R |
| 4,004,246 | 1/1977 | Hamada | 330/10 |
| 4,115,667 | 9/1978 | Babb | 179/115.5 VC |
| 4,130,725 | 12/1978 | Nagel | 179/1 A |
| 4,201,886 | 5/1980 | Nagel | 179/1 A |
| 4,240,036 | 12/1980 | Kohler | 330/10 |
| 4,249,136 | 2/1981 | Suzuki | 330/10 |
| 4,300,022 | 11/1981 | Hastings-James | 179/115.5 DV |

Primary Examiner—A. D. Pellinen
Assistant Examiner—L. C. Schroeder
Attorney, Agent, or Firm—Larry J. Palguta; John A. Young

[57] ABSTRACT

An electrodynamic acoustic transducer (54) having two voice coils (50, 52), the coils being addressed by amplified digital signals. The system (12, 60, 54) utilizes a preamplified analog input signal (10) which is supplied to a bifurcated network, one such signal being processed by an inverter (18). The analog signals (42, 44) are compared with triangular waves (38, 40) to effect switched signals (46, 48) that are pulse width modulated signals. The signals (46, 48) are then amplified through impedances (76, 78) and high speed, high current semiconductor switch means (80, 82) so that the amplified digital signals serve as driver means communicated to the separately addressable coilds (50, 52). There is a dynamic balance achieved by separate energization of the coils (50, 52) whereby the diaphragm (97) is positively located in both axial driving directions and is disposed in equilibrium positions by the energization and balancing of the respective coils (50, 52). As a result, the dynamic range, clarity, cleaness, and response time is substantially improved. An important aspect of this invention is the direct addressing of two distinct coils (50, 52) by amplified pulse trains which are of digital characteristic. The speaker (54) does not require mechanical restoring means but instead the suspension of the diaphragm (97) has a high compliance and serves only to maintain concentric relationship of the voice coils (50, 52) with the gap (92).

15 Claims, 8 Drawing Figures

DIGITALLY DRIVEN COMBINATION COILS FOR ELECTRODYNAMIC ACOUSTIC TRANSDUCERS

DESCRIPTION

1. Technical Field

This invention relates to an acoustical transducing means such as a loudspeaker, in which the transducer has two separately addressable coils, each such coil being addressed by signals which consist of a train of pulses derived from pulse-width-modulating means, and in which the coils are energized by wave forms of essentially digital characteristic in order to improve the transient response and dynamic range of the system, and the accuracy and clarity of the transduced sound.

2. Background Art

In electrodynamic acoustic transducers, it has long been the practice to energize the voice coil by means of a processed signal that is amplified and remains an analog type signal.

In order to provide a broad frequency range, it has been found necessary to provide speakers having overlapping frequency responses—a lower range frequency response speaker commonly referred to as a "woofer," an intermediate frequency response speaker known as "midrange or intermediate," and a high frequency response loudspeaker commonly referred to as a "tweeter." The analog signals for the acoustic transducer have a crossover network means which communicates the signals according to their frequency, to one or the other or all of the particular loudspeakers in order to provide an output sound which most closely approximates the input to the acoustic system.

For many years this general approach has been used but with the inherent shortcoming of an essential lack of frequency response of some loudspeakers which are incapable of responding to the full range of frequency signals, and which lack a broad dynamic range. There is lacking in some systems a clarity in response because of the need for mechanical restoring forces that impart characteristic distortions to the system. The prior art has attempted to overcome these deficiencies by using more than one functional oil in connection with an electrodynamic centering means. An example of this is U.S. Pat. No. 3,686,446 entitled, "PUSH-PULL MOVING COIL LOUDSPEAKER HAVING ELECTROMAGNETIC CENTERING MEANS," invented by Joseph W. Manger, and issued Aug. 22, 1972.

Other attempts at utilizing signals which employ more than one coil are U.S. Pat. No. 4,130,725 entitled "SPLIT-COIL SPEAKER WITH DIRECT COUPLING," invented by Martin J. Nagel, and U.S. Pat. No. 3,055,991 entitled, "LOUDSPEAKER," invented by R. Guss, issued Sept. 25, 1962. Still other teachings which attempt to achieve greater linearity of response and improved dynamic range utilize a "split-coil." An example of these includes U.S. Pat. No. 3,983,337 entitled "BROAD-BAND ACOUSTIC SPEAKER," issued Sept. 28, 1976, invented by Burton A. Babb.

The present invention proposes a distinctly different and unique approach in that the loudspeaker is actuated by two separate and independent speaker coils, each of which is independently and separately addressed by a digital signal so that the response of the speaker is obtained by a dynamic equilibrium effected by separately addressing the respective coils in unison. By digitally addressing both coils there is achieved a linearity of response, an improved dynamic range in which the sound output is characterized by low distortion, clarity, and by a faithful correspondence with the original sound which it is intended to reproduce.

DISCLOSURE OF THE INVENTION

The speaker of the present invention is energized by means of two speaker coils which are disposed in spaced, stacked relationship with each of the coils being separately addressed by a processed signal. The processed signal is originally derived from an analog signal which is preamplified in any conventional manner. A triangle wave generator supplies waves through a bifurcated network in which an inverter is located in one branch and then the waves are supplied to a pair of comparators. The preamplified analog signal is passed through a bifurcated network in which an inverter is located in one branch. The analog signals are supplied to the comparators in which the analog signals are converted to digital wave forms in which the modulated wave forms are complementary to each other. The two waves are now in digital form and are pulse width modulated. The wave forms are then passed through a driver consisting essentially of two identical networks each consisting of a high speed, high current semiconductor switch.

Two current dependent speaker coils are then powered by the amplified digital signals, with each coil separately and independently addressed. The sound output of the speaker is related to the net force output of the two coils which are in dynamic opposition so that the speaker diaphragm is at all times positively located and does not depend upon any mechanical return means for displacing the diaphragm to an equilibrium position as in some previous constructions.

Consequently, the output of the speaker has a degree of linearity and distortion free characteristics particularly at high volume, and the frequency response of the speaker is such that there may be no longer a need for crossover networks. Because the diaphragm is accurately vibrated responsively to this unique means of addressing two separate speaker coils, there is a high degree of reproduceability of sound within the dynamic range. In order to take advantage of the unique drive, there does not have to be a mechanical return or restoration force on the speaker. The speaker can be constructed with a soft surround, and the structural requirement is only that the speaker coils be centered radially with respect to the surrounding field and the diaphragm offer as little resistance as possible to the axial movement effected by the coils.

BEST MODE FOR CARRYING OUT THE INVENTION

Figure 1:
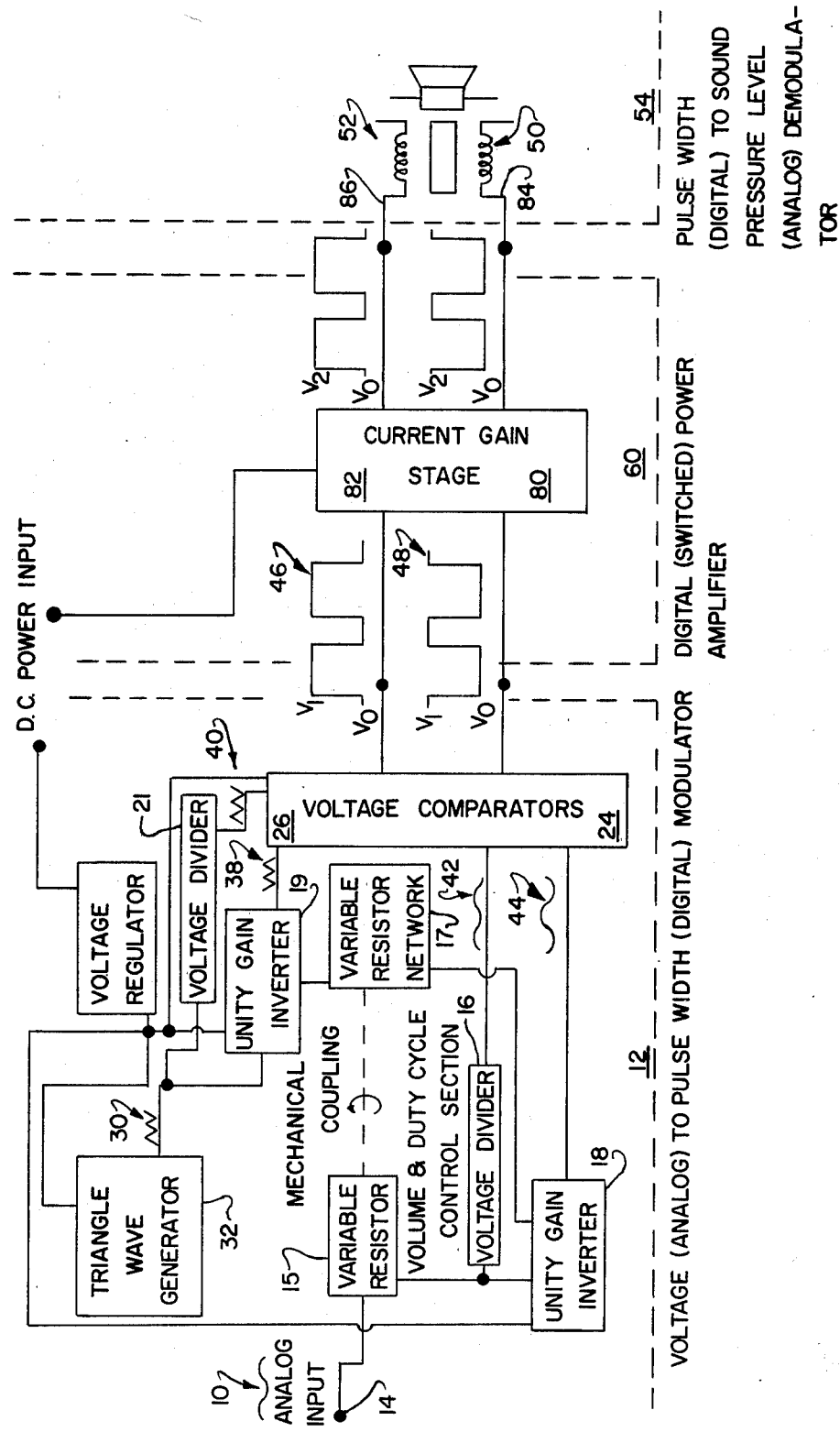
FIG. 1 is a block diagram illustrating the functional steps of signal processing, converting it first from analog form to digital form, and then amplifying and applying the digital signals to independently and separately addressable coils on the bobbin of the speaker, to vibrate the diaphragm of the speaker.

FIG. 1 illustrates the three basic components of the digital loudspeaker system—a pulse width modulator 12, a power amplifier 60, and a double coil speaker 54.

Figure 2:
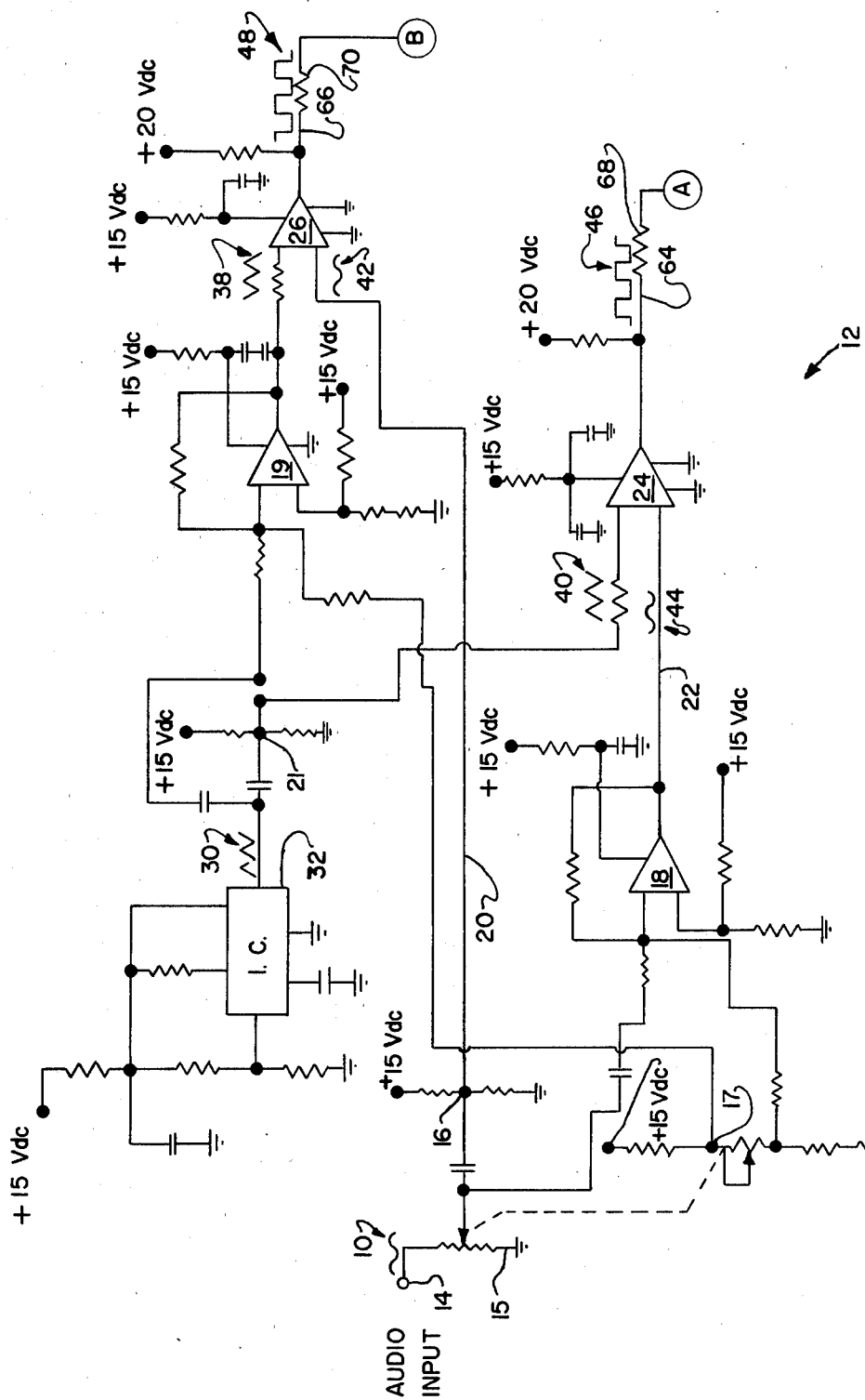
FIG. 2 is a simplified schematic view of a pulse width modulator, a driver, a speaker, and the wave forms generated at the respective locations of the simplified schematic circuit diagram.
Figure 3:
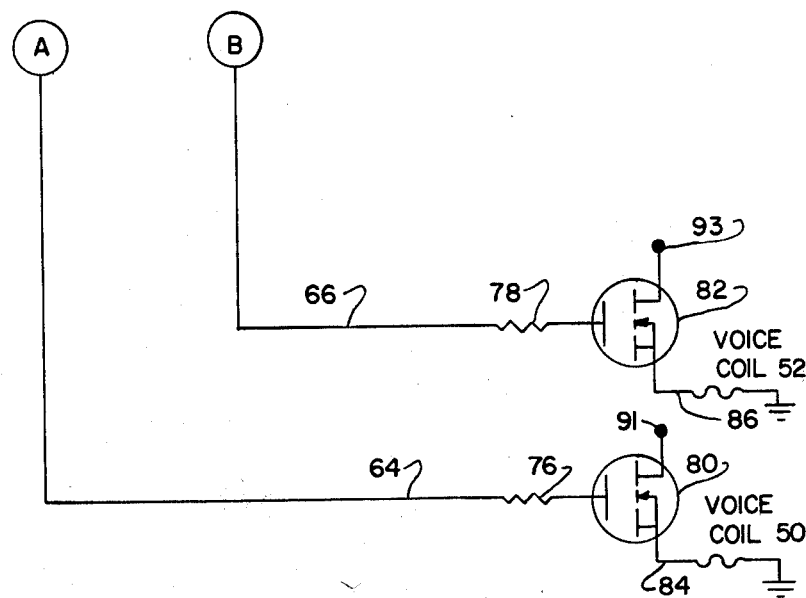
FIG. 3 is a simplified schematic view of the driver which receives the digital wave signals from the pulse width modulator of FIG. 2 and in which the pulses are substantially amplified to effect driving of a current dependent set of voice coils.

Referring now to FIGS. 1–3, an audio analog signal designated generally by reference numeral 10 is preamplified by any conventioal means. The preamplified audio signal 10 is then applied at terminal 14 to a pulse width modulator designated generally by reference numeral 12.

A variable resistor 15 modifies the signal, then the signal is divided into two branches and thereafter a voltage divider network 16 imposes a D.C. bias level on the analog signal in one branch, typically a $7\frac{1}{2}$ volt D.C. bias level, and the signal in the other branch is inverted by an inverter 18. The variable resistor 15 adjusts the amplitude of the analog input signal which correspondingly alters the amount of pulse width modulation effected by the modulator 12. A variable resistor 17 adjusts the D.C. bias level of an inverted trangle wave and the inverted analog wave and thereby determining the duty cycle of the modulator 12. As shown in FIG. 1, a mechanical coupling between the variable resistors 15 and 17 simultaneously modifies the amplitude of the analog input signal 10 and the bias level of the outputs of inverters 18 and 19 to correspondingly adjust the duty cycle in accordance with adjustments of the volume output of the system. The biased inverter analog signal 44 is communicated through branch 22 to a comparator 24; while the signal 42 in the branch 20 is communicated to comparator 26.

Function generator 32 supplies a 100 kHz triangular wave 40 to comparator 24 through voltage divider network 21. At the comparator 26 there is also provided a 100 kHz inverted triangular wave 38 biased by network 17, waves 38 and 40 originally developed as triangular wave 30 by function generator 32.

In FIG. 2, the triangular wave forms are designated generally by reference numerals 38 and 40 and the audio analog signals are designated generally by reference numerals 42, 44.

It has been found that when the two comparators 24, 26 switch at or near the same point in time, noise spikes of one of the comparators can be communicated to the other comparator to effect the output of the other comparator and cause distortion. In order to minimize this distortion, the comparators, through the use of an inverted triangle wave and an inverted analog wave, operatively switch on 180 degree phase shifted input signals to eliminate the cross talk and subsequent noise spike problem.

Figure 5:
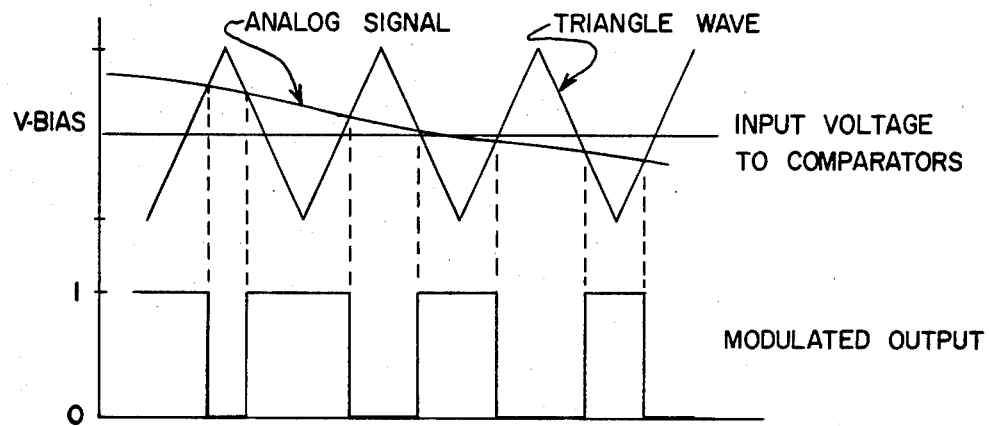
FIG. 5 illustrates an audio analog signal and a triangular wave which are compared by a comparator to produce a switched signal.

As shown in FIG. 5, each comparator acts as a switching network so that when the triangular voltage is greater than the audio wave, there is registered a zero output, and when the voltage of the audio signal is greater than the triangular wave form, there is registered a one. Thus, there is developed a rectangular wave output by each comparator, such waves being designated generally by reference numeral 46 and 48 in FIGS. 1 and 2.

Figure 6:
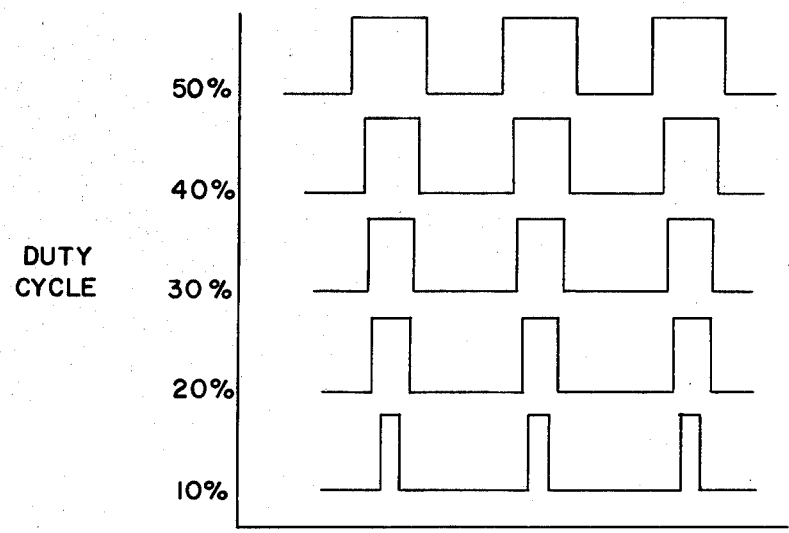
FIG. 6 illustrates the duty cycle of a series of wave forms i.e., the fraction of the frequency period represented by the width of the rectangular wave.

The time from pulse center to recurrent pulse center is known as the time period for the recurrent rectangular pulses and the ratio of the pulse width of the rectangular pulse to the time period is the duty cycle. The volume for the audio signal output, driving coils 50, 52 wound on bobbin 51 (FIGS. 4 and 8), is determined by the percentage of duty cycle modulation. The maximum amount of audio output that can be developed by the system would be from 100% modulation on a 50% duty cycle square wave. Thus, the mechanical coupling of FIG. 1 will change both the amplitude of the analog input signal and the duty cycle so that the adjusted duty cycle is never over-modulated. The relationship can also be expressed by referring to FIG. 6 in which the narrower rectangular wave forms correspond to a low power output, and as the volume output is increased, the duty cycle developed by the rectangular wave is proportionally increased.

Another way of illustrating this in reference to FIG. 5, is that the amplitude of the input analog signal determines the volume output of the speaker. When the input analog signal intersects the triangular wave at high points on the triangular wave, a wider pulse occurs. Conversely, when the input analog signal intersects lower points on the triangular wave, a narrower pulse occurs. The change from the widest to the narrowest pulse is the amount of modulation. If the amplitude of the input analog signal is changed by adjustment of variable resistor 15 (See FIG. 1), then the widths of the pulses will be proportionally changed. A change in the D.C. bias level of the inverted triangular wave and inverted analog signal by adjustment of variable resistor 17 correspondingly changes the duty cycle. Therefore, the mechanical coupling of FIG. 1 changes simultaneously the attenuation of the analog input signal and the D.C. bias level of the inverted triangle wave and inverted analog wave so that there is a change in the amount of modulation and a corresponding change in the duty cycle. This serves to utilize only the amount of power required to energize the coils for the desired volume output, thereby greatly increasing the efficiency of the system.

Figure 7:
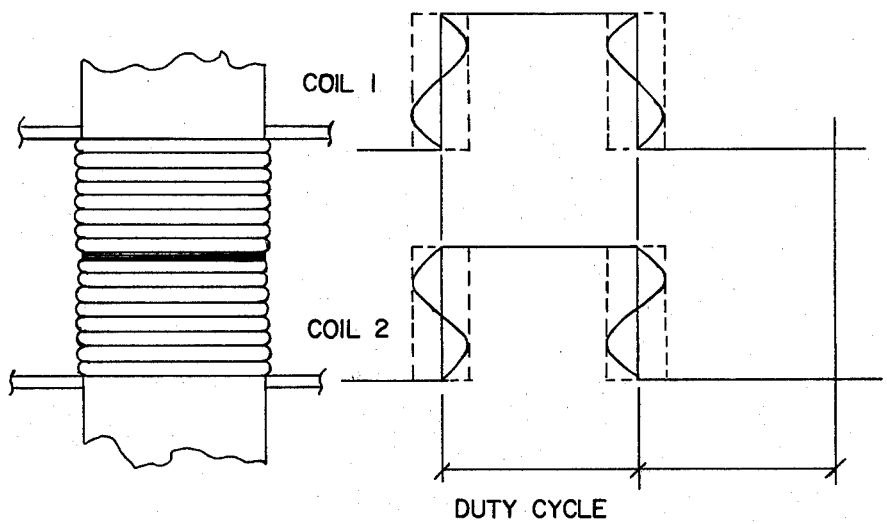
FIG. 7 illustrates a pulse width modulated rectangular wave having a pulse width which is a function of the audio input of the system of the present invention.

As shown in FIG. 7, the train of pulses is width modulated since there is imposed on the train of pulses a variation in width as a function of the characteristics of the analog wave. Thus, as the analog wave varies in amplitude, there is a corresponding change in the width of the pulses.

Referring to FIG. 3, each of the rectangular pulse trains is applied to a respective one of the coils 50, 52 after having passed through a driver which is designated generally by reference numeral 60.

The driver 60 consists of two driving circuits, one for each of the respective rectangular pulse trains developed by the pulse width modulator 12. As shown in FIG. 2, each of the digital output signals 46, 48 are communicated through lines 64, 66 and resistors 68, 70 to branched portions of a driver 60. At the driver are resistors 76 and 78, and two VMOS (vertical metal oxide semiconductor) transistors 80, 82 which characteristically have high input impedance and nanosecond switching times so that signals applied through the lines 84, 86 have the same wave characteristics as the square wave forms communicated through input lines 64, 66. The amplified digital signals are communicated to the voice coils 50, 52, the two coils 50, 52 being current dependent. VMOS audio circuit applications have been described in Chapter 5 of *Design of VMOS Circuits with Experiments*, Robert T. Stone and Howard M. Berlin, published 1980 by Howard W. Sams & Co., Inc., as part of The Blacksburg Continuing Education ™ Series.

Figure 8:
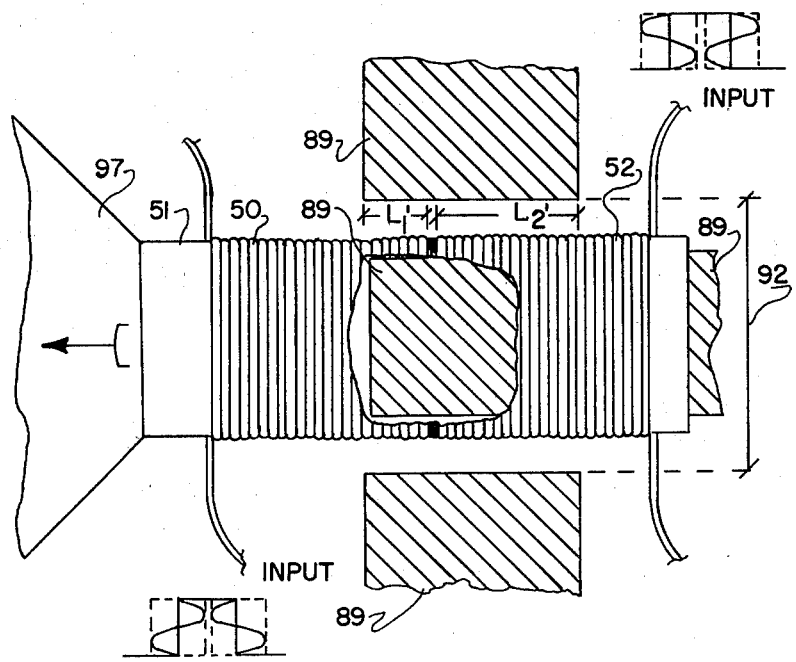
FIG. 8 illustrates a schematic view of the speaker with voice coils, the voice coils being disposed within an opening or gap in a permanent magnet circuit, the position of the bobbin determining the effective length of conductors within the gap.

The effect of current on the voice coils can be best understood by reference to the enlarged detail views (FIGS. 4 and 8) of the voice coils within the magnetic field effected by the permanent magnet circuit. The relationship of displacement of the voice coils and speaker diaphragm 97 is in accordance with a force balancing system. The system uses a permanent magnet in conjunction with pole pieces 89 to provide a magnetic field within annular gap 92. The flux density in the gap is essentially constant, but current to each of the coils is variant. For example, when the pulse width modulation addressing the coil 50 dictates a greater average current than that for coil 52, the speaker coil displacement is in accordance with the formula $BL_1I_1 = BL_2I_2$; where the constant flux density is represented by the value B, $I_1$ is the current in coil 50, $I_2$ is the current in coil 52, and $L_1$ is the effective conductor length of coil 50 in the gap 92 and $L_2$ is the effective conductor length of coil 52 in the gap 92. If the current to one coil is increased while the current to the other is decreased, the force balance is upset so that $BL_1I_1$ does not equal $BL_2I_2$ and motion will occur in the direction of the coil receiving the greater current. The coils are arranged so that as axial displacement occurs, some of the conductors receiving the greater amount of current leave the area of the annular gap 92. The current in the conductors remaining in the field at the equilibrium position then develops a force equal to the force developed by the increased number of conductors in the other voice coil which are drawn within the magnetic field but which have a lower current. As shown in FIG. 8, an equilibrium position is reached where $BL_1,I_1 = BL_2,I_2$ because the $L_1$, is reduced sufficiently in relation to $I_1$ so that the product $BL_1,I_1$ equals $BL_2,I_2$. Inasmuch as the length of the conductors $L_2$, increases relative to $L_1$, at the lower current $I_2$ equilibrium is reached by proportioned movement decreasing the effective conductor length $L_1$, in the magnetic field and increasing the effective conductor length $L_2$, within the field as the BLI products are balanced by proportioned changes of effective conductor lengths.

Thus, when the average current of one coil is differential in relation to the other coil, motion will always occur in the direction of an equilibrium point, the displacement continuing until at the new position $BL_1I_1 = BL_2I_2$, and force balance is achieved.

Of course, these changes can occur very rapidly and the voice coils are displaced back and forth always as a function of the pulse width modulation. But because the voice coils are positively displaced in both directions and because of the "soft surround" of the diaphragm 97, the resulting sound has a much greater frequency response and the speed of response makes the speaker develop a cleaner sound over a wide frequency range. Because the coils provide the positioning force and do not depend on axial mechanical restoring forces (spiders, stiff surrounds, etc.) as present day speakers do, the forces produced by the coils can be better utilized to increase dynamic range and frequency response as well as eliminating the distortions caused by the mechanical restoring forces. Distortion caused by nonlinearities in the driving stage are greatly reduced by this system.

Figure 4:
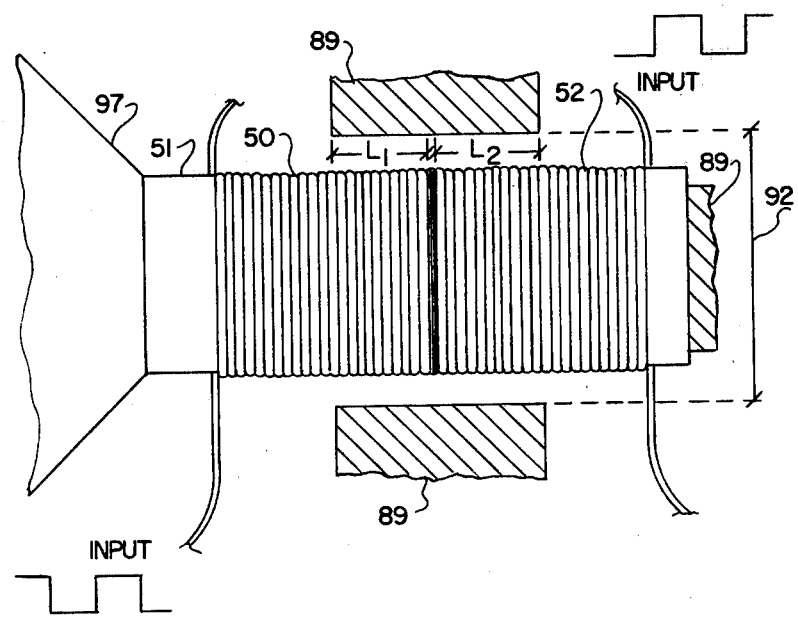
FIG. 4 represents the method by which the speaker coils are returned to a neutral position when there is no applied signal from the audio analog input, this being achieved by an equal duty cycle pulse train going to each coil so that current is equal in each coil and the bobbin moves to a centered position.

Whenever there is no input analog signal, the duty cycles of the coils are equal and there is no pulse width modulation. Therefore, the average current to both coils is the same and the voice coils will move to a position where the bobbin is evenly located lengthwise in the gap and $L_1 = L_2$ (FIG. 4).

Any form of digital modulation that accomplishes average current variation to the coils would suffice to drive this system. For example, systems utilizing pulse amplitude modulation or pulse rate modulation would vary the current for a dual coil loudspeaker construction.

The result of this force balance system is that unlike the speakers of the prior art which require mechanical spring means, a high compliance surround may be used on the outer periphery of the diaphragm. All that is required is a positioning of the voice coils radially relative to the gap, and a high compliance spider may be used to accomplish this.

Because the response characteristics of the speaker correspond to the rectangular wave pulses, and because there is very little resistance to the movement of the diaphragm, many important functional improvements are realized from the speaker: there is less distortion developed by the speaker, a much faster response time is achieved, and the frequency range is broadened. As a result, the clarity of the sound and the "cleanness" of the sound are much improved over a wide frequency band.

Also, because pulse width modulation is in digital form and directly drives the voice coils through a driver, there is an improved dynamic range without introducing distortion. In other words, the pulse width modulated signals will positively drive the two coils more accurately, with greater efficiency, and with less distortion than a conventional drive utilizing a analog signal as the power means for displacing the diaphragm through the voice coils, such conventional structures having nonlinear mechanical springs for displacement of the voice coil or coils.

OPERATION

There is a dynamic force balance system in the speaker 54 developed by the two coils 50, 52 wound on the bobbin 51. The force imbalance on the coils is caused by the pulse width modulated trains of rectangular waves 46, 48, addressing the two coils and corresponding to the analog signals representing the analog input to the system. The dynamic force balance system is such that when the current ($I_1$) and an effective conductor length ($L_1$) of the coil 50 within the magnetic field, is balanced against the current ($I_2$) and the effective conductor length ($L_2$) of the coil 52, then the relationship of $BL_1I_1 = BL_2I_2$ exists.

As shown in FIG. 8, whenever the currents applied to the coils 50, 52 are unequal, movement is effected until the relationship $BL_1,I_1 = BL_2,I_2$ is satisfied. This constant change in accordance with pulse width modulation results in a driving of the speaker diaphragm positively in axial directions and develops an acoustic output which corresponds to the sound represented by the analog signal input 10 supplied to the modulator 12.

The coil construction is such that there is some slight "overhang" of coils, meaning an extension beyond the gap 92, regardless of the excursion of the speaker coils 50, 52, so that the displacement of the coils is always a function of the differential current in the respective coils.

Each coil is independently addressed by a digital signal which is pulse width modulated. This is achieved by developing first an audio analog signal 10 (FIGS. 1 and 2) which is processed through a pulse width modulator 12. The input audio analog signal 10 undergoes in one branch a fixed D.C. biasing through a voltage divider network 16, and in the other branch the signal is inverted by an inverter 18 and variably biased by network 17, and is communicated in its inverted form 44 to a comparator 24. The noninverted analog signal is communicated in wave form 42 to a comparator 26.

At the two comparators 24, 26, the audio analog signals are converted to a train of digital pulses whose period is equal to that of the triangular waves. The width of each pulse is modulated by the amplitude of the analog signals supplied to the comparator 24, 20. The pulse width modulated signals are then amplified through driver circuit 60. The pulse width modulations are separately communicated through input lines 64, 66 and each signal is current amplified by the respective circuit containing one of the impedances 76, 78, and VMOS transistors 80, 82. The power communicated through terminals 91, 93 is switched by the respective VMOS transistor so that the current dependent coils 50, 52 are each driven by an amplified signal corresponding to the pulse width modulated signals developed by the modulator 12.

In operation, the voice coils 50, 52 are always positively driven and do not rely upon springs or other mechanical restoration means. The equilibrium position for the voice coils is the position in which the relationship $BL_1I_1 = BL_2I_2$ in which the L refers to the effective conductor length of each coil within the magnetic field and I refers to the average current in each coil as determined by the pulse width modulated wave train.

It is the percentage modulation of the duty cycle which determines the volume output of the speaker. The relative value of the average currents applied to the two coils represents the amount of driving force acting on the voice coils. The amount of imbalance in the average currents in the voice coils caused by the input analog signal determines the volume output of the speaker.

The pulse width modulation effects the vibrations imposed on the diaphragm 97 of the speaker 54, which is the transduced signal directly related to the audio analog input signal 10 at terminal 14.

CONCLUSION

Although the present invention has been illustrated and described in connection with example embodiments, it will be understood that this is illustrative of the invention, and it is by no means restrictive thereof. It is reasonably to be expected that those skilled in the art can make numerous revisions and additions to the invention and it is intended that such revisions and additions will be included within the scope of the following claims as equivalents of the invention.

We claim:

1. In combination with an acoustical transducer having at least two independently addressable coils, a modulator and amplifier comprising means for converting an analog input signal to pulse width modulated signals and amplified output means for addressing the signals to respective ones of said coils.

2. The combination in accordance with claim 1, further comprising preamplifier means for providing an analog input signal to said means for converting the analog input signal.

3. The combination in accordance with claim 1, wherein said amplified output means includes a driver means between said converting means and a respective one of said coils, said driver means including transistor means comprising a high impedance, high current transistor having characteristic fast-switching qualities to effect energization of the coil.

4. The combination in accordance with claim 1, in which the response of said acoustic transducer is characterized by a broader dynamic range.

5. The combination in accordance with claim 1, in which the amplitude of the acoustical tranducer output is in accordance with the pulse width modulation wherein the average duty cycle ranges from 50 percent duty cycle or lower, and each such coil is independently energized.

6. The combination in accordance with claim 1, in which the acoustical transducer is characterized by higher volume with less distortion, and comprises a direct drive between said converting means, amplified output means, and the respective coils of said acoustic transducer.

7. The combination in accordance with claim 1, including a coupling means for simultaneous adjustment of the analog input signal to the modulator and the average duty cycle of the modulator output.

8. An acoustical transducer system comprising a modulator means for converting preamplified analog input signals to modulated switched signals, a means for amplifying the output of the modulating means, and a dual coil acoustical transducer means having independently addressable coils for receiving respective signals of the amplified modulated output.

9. A process for transducing electrical signals to an acoustical output of an electrodynamic acoustic transducer comprising the steps of applying a preamplified analog signal to a switched converting means, converting the preamplified analog signal input through said switched converting means to effect conversion of the analog signal to pulse width modulated switched signals, amplifying the output of the converting means, and communicating the amplified switched signals to selected ones of addressable coils whereby the switched signals generate a driving force effecting an acoustical output.

10. A process for converting an electrical signal to an acoustic signal through an electrodynamic acoustic transducer comprising the steps of generating an analog signal, communicating such signal to a pulse width modulated signal transformation means, communicating the output in amplified form to said acoustic transducer, and separately addressing each of two coils with the amplified output to effect said acoustic signal.

11. The process in accordance with claim 10, including the step of comparing inverted analog signals with respective triangle waves to effect a conversion from analog to switched signal output consisting essentially of pulse width modulated wave forms, and communicating such pulse width modulation output in amplified form to respective ones of said coils to effect coil displacement in relationship to the amplified output.

12. The process in accordance with claim 10, including the step of limiting the excursion of said coils to effect an improved dynamic range.

13. The process in accordance with claim 10, including the step of driving the acoustic transducer through the coils by addressing the respective coils through a driver including a high impedance, high current transistor means characterized by fast switching.

14. The process in accordance with claim 10, wherein said amplifying is effected through a bifurcated addressing means each including a transistor means characterized by high input impedance and high output current and effective in switching response matched with the pulse width modulation whereby each coil is addressed as a current dependent means.

15. The process in accordance with claim 10, in which lower distortion of said acoustic transducer is effected by a substantially linear response of said transducer in accordance with the amplified pulse width modulated signals.

* * * * *